United States Patent [19]
Cronin et al.

[11] Patent Number: 6,143,640
[45] Date of Patent: Nov. 7, 2000

[54] METHOD OF FABRICATING A STACKED VIA IN COPPER/POLYIMIDE BEOL

[75] Inventors: John E. Cronin, Milton, Vt.; Barbara J. Luther, Cold Spring, N.Y.

[73] Assignee: International Business Machines Corporation, Armonk, N.Y.

[21] Appl. No.: 08/936,090

[22] Filed: Sep. 23, 1997

[51] Int. Cl.[7] .................................................. H01L 21/768
[52] U.S. Cl. ...................... 438/618; 438/622; 438/624; 438/625; 438/634; 438/637
[58] Field of Search ..................... 438/622, 634, 438/623, 624, 625, 637, 648, 618, 638, 640

[56] References Cited

U.S. PATENT DOCUMENTS

| | | |
|---|---|---|
| 3,726,002 | 4/1973 | Greenstein et al. . |
| 4,610,078 | 9/1986 | Matsukawa et al. . |
| 4,702,792 | 10/1987 | Chow et al. . |
| 4,789,648 | 12/1988 | Chow et al. . |
| 4,832,789 | 5/1989 | Cochran et al. . |
| 4,888,087 | 12/1989 | Moslehi et al. . |
| 4,982,266 | 1/1991 | Chatterjee .................. 438/624 |
| 5,091,289 | 2/1992 | Cronin et al. . |
| 5,100,817 | 3/1992 | Cederbaum et al. . |
| 5,112,765 | 5/1992 | Cederbaum et al. . |
| 5,126,006 | 6/1992 | Cronin et al. . |
| 5,213,916 | 5/1993 | Cronin et al. . |
| 5,229,257 | 7/1993 | Cronin et al. . |
| 5,334,467 | 8/1994 | Cronin et al. . |
| 5,514,613 | 5/1996 | Santadrea et al. ........... 438/622 |
| 5,607,873 | 3/1997 | Chen et al. ................. 438/622 |
| 5,827,776 | 10/1998 | Bandyopadhyay et al. ...... 438/624 |
| 5,886,410 | 3/1999 | Chiang et al. .............. 438/623 |

FOREIGN PATENT DOCUMENTS 08316310  5/1995  Japan .

*Primary Examiner*—Mary Wilczewski
*Assistant Examiner*—Yung A. Lin
*Attorney, Agent, or Firm*—DeLio & Peterson LLC; Peter W. Peterson; Howard J. Walter, Jr.

[57] ABSTRACT

A structure and method for connecting two levels of interconnect vertically spaced from each other by another level of interconnect by forming a first interconnect region to which contact is to be made, a first insulating layer over the interconnect region, and an etch-stop layer over the first insulating layer, and etching the etch stop layer to form an opening at a position over the first interconnect region. A second interconnect region is formed in contact with the first insulating layer and above the first interconnect region, a second insulating layer is formed over the first insulation layer and the etch stop layer, and an opening is formed in the second insulating layer overlapping the opening in the etch stop layer. The opening in the second insulating layer is extended through the first insulating layer and the openings in the first and second insulating layers are filled with a conductor to create a connection between the first interconnect region and a region above the second insulating layer.

25 Claims, 9 Drawing Sheets

METHOD OF FABRICATING A STACKED VIA IN COPPER/POLYIMIDE BEOL

BACKGROUND OF THE INVENTION

1. Field of the Invention

This invention relates to multilevel electronic circuits and in particular to a method and structure for interconnecting different conductor levels in a multilayer structure.

2. Description of Related Art

Advanced interconnections schemes for VLSI (Very Large Scale Integration) multilayer circuits have evolved to the use of copper as the wiring levels and polyimide as the insulators, thus giving the lowest possible conductivity and permitivity, i.e., low resistance and low capacitance. As this copper/polyimide technology has evolved, damascene has become the wiring method of choice. Damascene construction refers to the depositing and planarizing of an insulator, etching an insulator groove or trench to form the wiring structure, plating copper over the insulator structure to fill the groove, and then chemical-mechanical polishing the copper such that it is coplanar with the polyimide, creating the final copper in the polyimide structure. Damascene construction is described in U.S. Pat. No. 4,789,648, assigned to the assignee of the present invention, and which is hereby incorporated by reference. However, it has been found that a nitride layer such as silicon nitride is required over the copper/polyimide structure for multi-level structures in order to deposit the next polyimide layer. In essence, the thin nitride layer acts as an etch stop when etching polyimide, and as a passivation over the copper to minimize and/or eliminate copper oxidation.

In older generations of technologies, the formation of stacked vias, for example, a direct M3 to M1 connection, required an impact to ground rules, that is, the stacked vias required independent definition of all the via and wiring levels in between the levels required to be connected, and therefore, because of minimum image size and overlay, and the concern that the subsequent via had to be within the metal landing pad to eliminate an unwanted shorting region, the density is degraded when a stacked via is applied. Also, the stacked via required multiple wiring connection interfaces and thus, contact and via resistance were an issue. Finally, in order to get around these overlay issues, the stacked via may have required a separate masking level to insure ground rules were maintained.

Bearing in mind the problems and deficiencies of the prior art, it is therefore an object of the present invention to provide a method for making a stacked through via without any additional masks.

It is another object of the present invention to provide a method for making a stacked through via without any additional interconnection resistance.

A further object of the invention is to provide a method for making a stacked through via without impact to ground rules.

Still other objects and advantages of the invention will in part be obvious and will in part be apparent from the specification.

SUMMARY OF THE INVENTION

The above and other objects apparent to those skilled in the art are achieved in the present invention which provides a method for connecting two levels of interconnect vertically spaced from each other by another level of interconnect comprising the steps of:

a) forming a first interconnect region to which contact is to be made;

b) forming a first insulating layer over the interconnect region;

c) forming an etch-stop layer over the first insulating layer;

d) etching the etch stop layer to form an opening at a position over the first interconnect region;

e) forming a second interconnect region in contact with the first insulating layer and above the first interconnect region;

f) forming a second insulating layer over the first insulation layer and the etch stop layer;

g) forming an opening in the second insulating layer, the opening in the second insulating layer overlapping the opening in the etch stop layer;

h) extending the opening in the second insulating layer through the first insulating layer; and i) filling the openings in the first and second insulating layers with a conductor to create a connection between the first interconnect region and a region above the second insulating layer.

Preferably, the second insulating layer is formed over the second interconnect region. The first interconnect region may comprises a conductive line formed in the first insulating layer and the second interconnect region may include a conductor formed in the first insulating layer, wherein the second interconnect region contacts a portion of the first interconnect region.

Preferably, the opening in the etch stop layer and the first and second insulating layer comprises a first opening. In such case, the method further includes the steps of forming a second opening in the etch stop layer and the second insulating layer overlapping the second interconnect region and filling the second opening with a conductor to create a connection between the second interconnect region and a region above the second insulating layer. Also, the step of forming a second opening in the etch stop layer preferably does not remove any etch stop layer portion adjacent to the second interconnect region and over the first insulating layer.

In another preferred embodiment, the etch stop layer comprises a first etch stop layer and the method further includes the steps of forming a second etch stop layer over the second insulating layer and forming a third insulating layer over the second etch stop layer, and wherein step (g) includes forming openings in the second etch stop layer and the third insulating layer which overlap the opening in the first etch stop layer and step (i) includes filling the openings in the second etch stop layer and the third insulating layer with the conductor to create a connection between the first interconnect region and a region above the third insulating layer. Also, the opening in the first and second etch stop layers and the first, second and third insulating layers may comprise a first opening and the method further includes the steps of forming a second opening in the etch stop layers and the insulating layers overlapping the second interconnect region and filling the second opening with a conductor to create a connection between the second interconnect region and a region above the third insulating layer.

In another aspect, the present invention provides a multilevel wiring structure produced by the aforementioned methods. Such a multilevel wiring comprises a first interconnect region to which contact is to be made, a first insulating layer over the first interconnect region, and an etch-stop layer over the first insulating layer, the etch stop layer having an opening at a position over the first interconnect region. The wiring structure also includes a second interconnect region in contact with the first insulating layer and above and in contact with the first interconnect region and a second insulating layer over the first insulation layer, the etch stop layer and the second interconnect region. An opening in the second insulating layer overlaps the opening in the etch stop layer and extending through the first insulating layer and is filled with a continuous conductor between the first interconnect region and a region above the second insulating layer.

Preferably, the second insulating layer is over the second interconnect region, the first interconnect region comprises a conductive line in the first insulating layer, the second interconnect region includes a conductor in the first insulating layer, and the second interconnect region contacts a portion of the first interconnect region.

In the multilevel wiring structure, the opening in the etch stop layer and the first and second insulating layer may comprise a first opening and the circuit may further include a second opening in the etch stop layer and the second insulating layer overlapping the second interconnect region. The second opening is filled with a continuous conductor to create a connection between the second interconnect region and a region above the second insulating layer. The etch stop layer is adjacent to the second interconnect region and over the first insulating layer.

The etch stop layer may comprises a first etch stop layer and the wiring structure may further include a second etch stop layer over the second insulating layer, a third insulating layer over the second etch stop layer, and an opening in the second etch stop layer and the third insulating layer which overlaps the opening in the first etch stop layer. The openings in the second etch stop layer and the third insulating layer are filled with a continuous conductor between the first interconnect region and a region above the third insulating layer. This wiring may further include a second opening in the etch stop layers and the insulating layers overlapping the second interconnect region, the second opening being filled with a continuous conductor between the second interconnect region and a region above the third insulating layer.

In a further aspect, the present invention provides a method for connecting at least two levels of interconnect vertically spaced from each other comprising the steps of:
a) forming a first interconnect region comprising first and second conductors to which contact is to be made;
b) forming a first insulating layer over said first interconnect region;
c) forming a first via in said first insulating layer and in contact with said first conductor;
d) forming a second interconnect region over said first insulating layer comprising a third conductor in contact with said first via;
e) forming a second insulating layer over said first insulating layer; and
f) forming in said second insulating layer a second via within the perimeter of and in contact with said third conductor and a third via continuously extending further through said first insulating layer and in contact with said second conductor, said portion of said third via being out of contact with said second interconnect region.

Preferably, the method further includes forming in said second interconnect region a fourth conductor out of contact with said first via and a fourth via within the perimeter of and in contact with said fourth conductor.

In a related aspect, the present invention is directed to the multi-level wiring structure produced by the aforementioned method.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
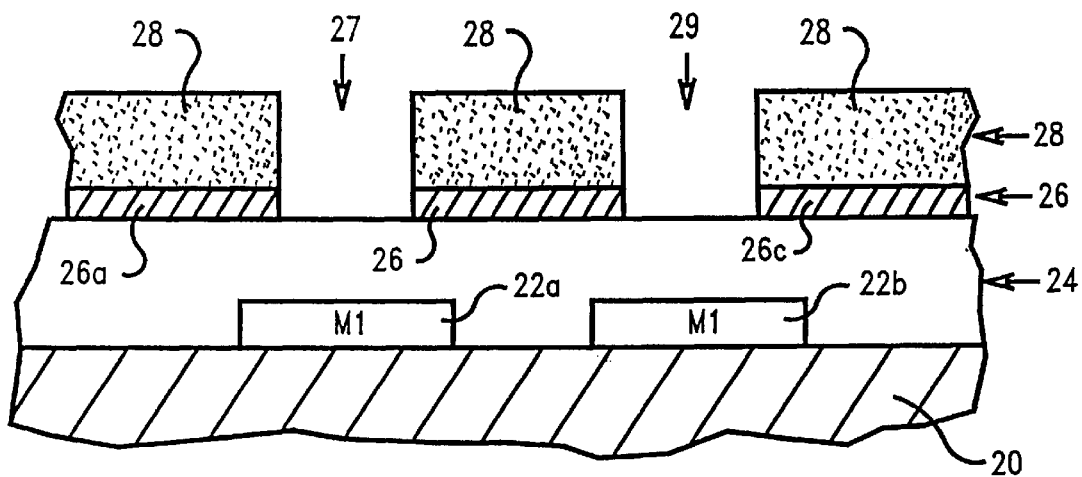
FIG. 1 is a side elevational view of a first stage of construction of the preferred stacked via of the present invention.

In describing the preferred embodiment of the present invention, reference will be made herein to FIGS. 1–16 of the drawings in which like numerals refer to like features of the invention. Features of the invention are not necessarily shown to scale in the drawings.

The present invention is directed in particular to multi-level electronic circuits and other structures which may be made by otherwise well-known photolithographic methods. The construction of the stacked via of the present invention in a Cu/polyimide BEOL (Back End Of the Line) is described in the aforementioned drawing FIGS. 1–16. Unless otherwise described, the various layers are constructed by deposition, etch and other techniques well-known in the art. FIG. 1 shows a first stage in which there is provided a generalized substrate 20 having a pair of spaced first M1 metallic conductive lines or interconnect levels 22a, 22b in contact with the upper surface of the substrate on which other features or connections may be present. As used herein, the term "line" used in connection with the described multilevel electronic structures refers to a conductive metallic connection between elements on one level of the structure. The term "via" refers to a conductive metallic connection between elements on different levels of the structure. The term "interconnect" refers to both via and line conductive metallic connections.

Above and around the M1 electrical conductors is an organic insulator layer 24, such as a polyimide. The M1 conductors may be formed by depositing copper or some other conductive material in trenches formed in the insulative layer. A continuous etch stop layer 26 is formed on the insulator layer 24 from an insulator such as silicon nitride. As used herein, the term "etch stop" refers to a material or materials which are resistant to an etchant, when that etchant is used to remove the insulator material above the etch. For example, silicon nitride is an etch stop when etching a polyimide. An etch stop layer such as a nitride layer can itself be removed by an etchant specific to it without removing polyimide. A continuous resist layer 28 is deposited over etch stop layer 26. Resist layer 28 is exposed to light in regions 27 and 29 and then developed. Etch stop layer 26 is then etched, using resist layer 28 as a mask in regions 27 and 29. Regions 27 and 29 will define regions where vias will be defined.

Figure 2:
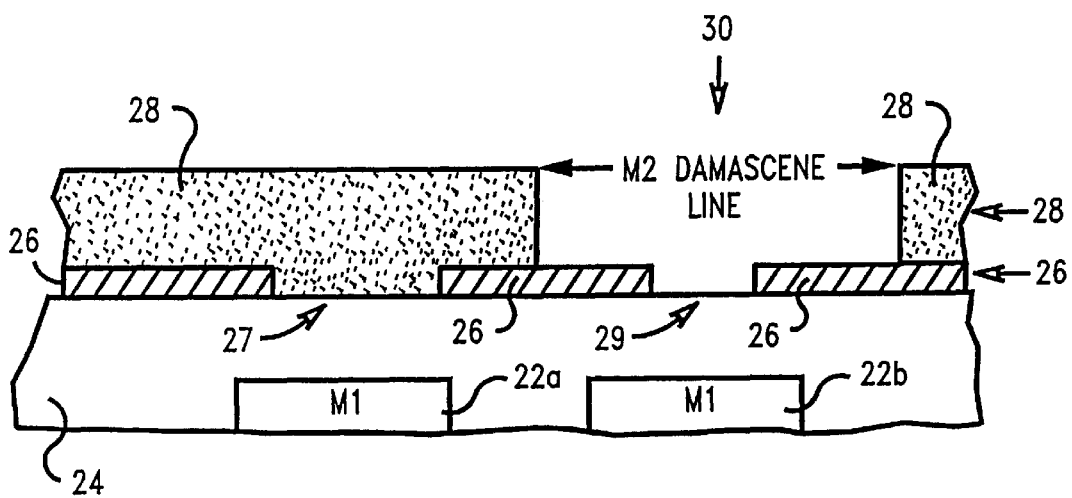
FIG. 2 is a side elevational view of a second stage of construction of the preferred stacked via of the present invention.
Figure 3:
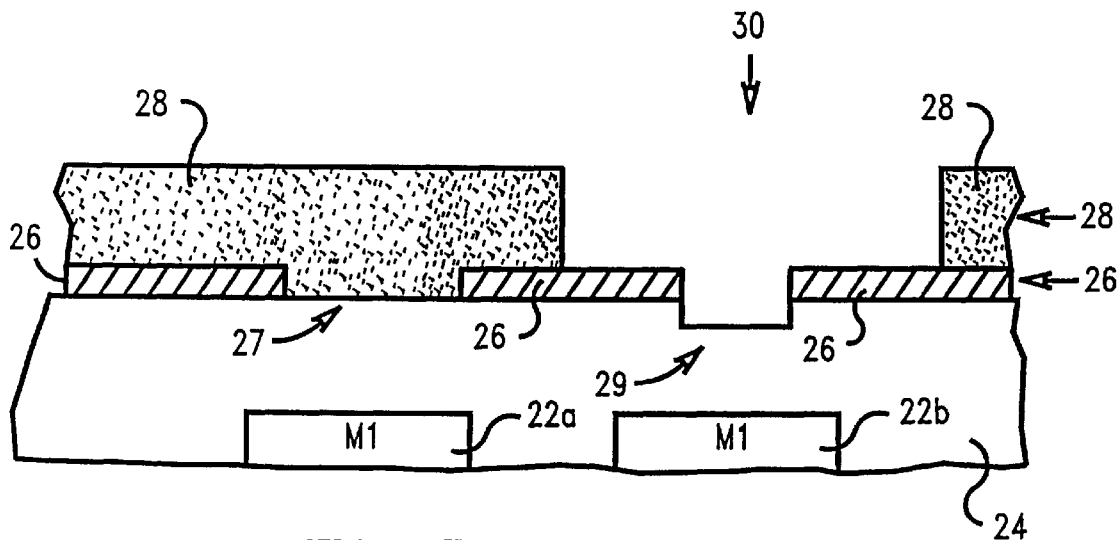
FIG. 3 is a side elevational view of a third stage of construction of the preferred stacked via of the present invention.

FIG. 2 shows the structure of FIG. 1 after the first resist layer 28 has been wet stripped and a second resist layer 28 has been applied, exposed and developed to open region 30 where the M2 damascene interconnect line will be formed. The resist 28 covers region 27, but leaves open region 29. Region 29 will be used to create a via. After etching, a partially formed via 32 is made (FIG. 3). A via will eventually be formed at area 32 between M1 conductive layer portion 22b and what will be an M2 interconnect layer in an otherwise standard dual damascene process. A nitride as layer 26 acts as an etch stop when etching the polyimide in an oxygen RIE (reactive ion etching) process.

Figure 4:
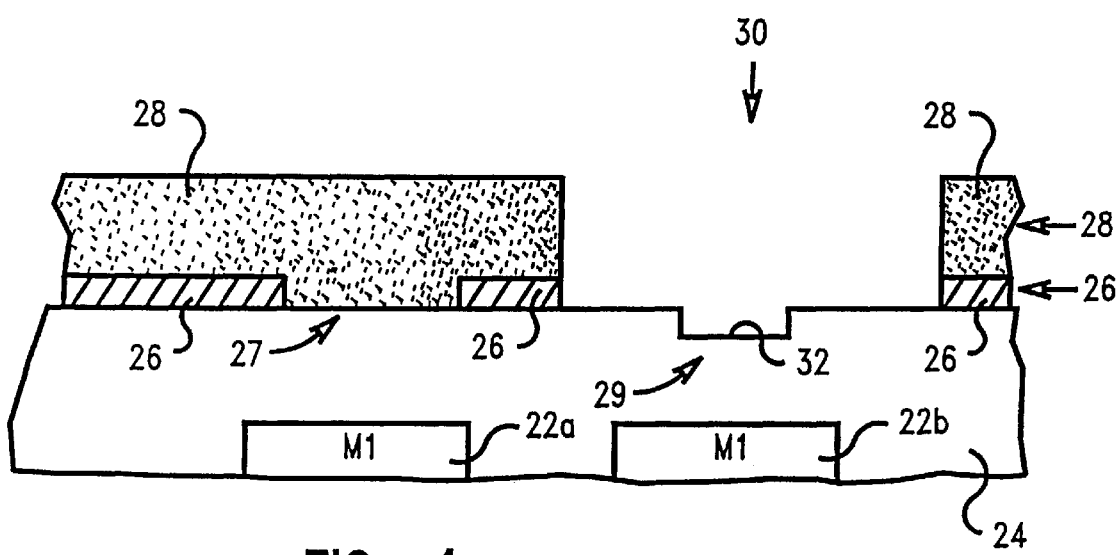
FIG. 4 is a side elevational view of a fourth stage of construction of the preferred stacked via of the present invention.
Figure 5:
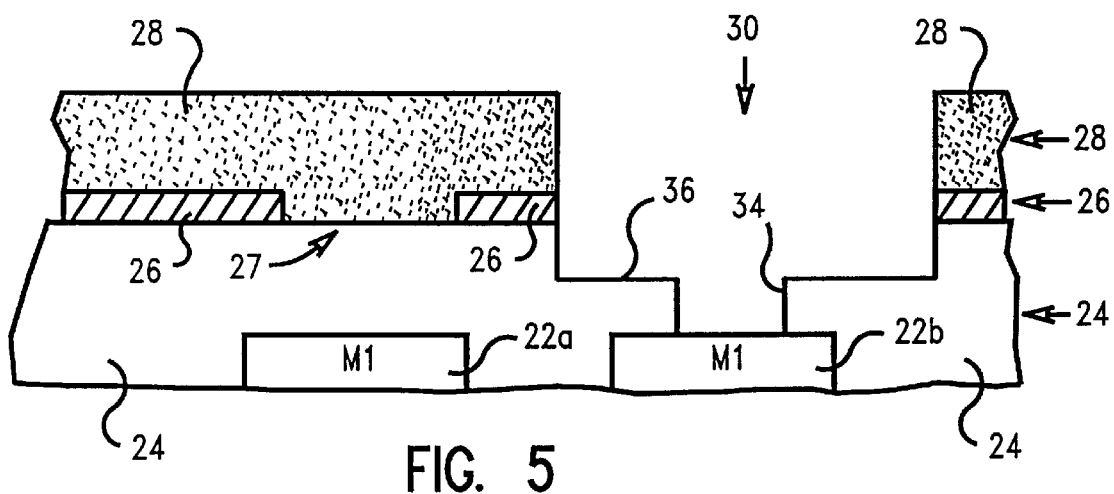
FIG. 5 is a side elevational view of a fifth stage of construction of the preferred stacked via of the present invention.

In the next step, as depicted in FIG. 4, portions of etch stop layer 26 are themselves etched away in the area in region 30, using resist layer 28 as a mask for the etchant. After these portions of etch stop layer 26 are removed, the polyimide on region 30 is etched with an etchant for the insulator layer 24. FIG. 5 shows the polyimide layer after being etched in the area below region 30, while resist layer 28 is still in place. In particular, resist layer 28 still covers the stacked through via in region 27. The original surface of the insulator layer 24 and partial via area 32 are uniformly etched to form line 36 and via 34 (FIG. 5). The etched region formed in the insulator layer will create the via and the line openings to be subsequently described.

Figure 6:
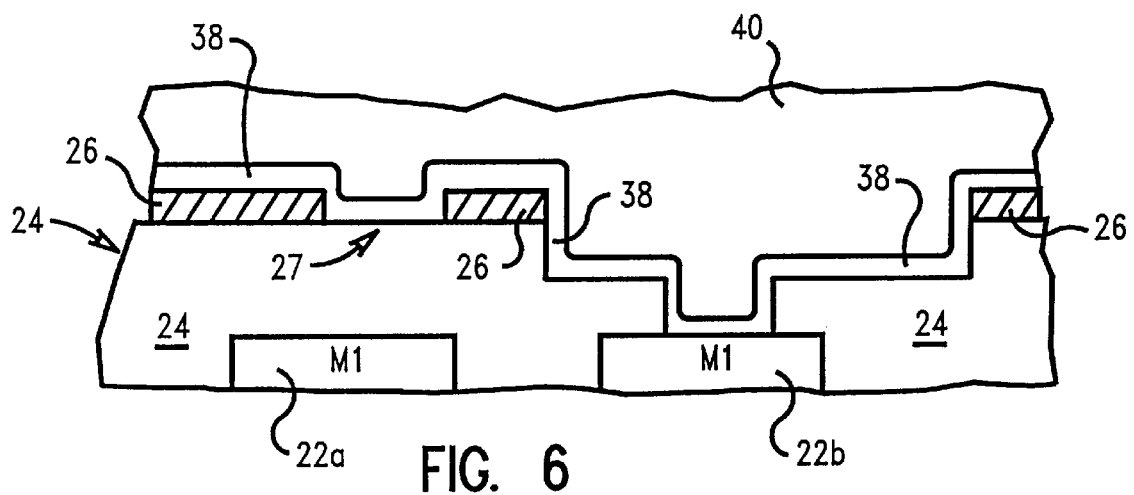
FIG. 6 is a side elevational view of a sixth stage of construction of the preferred stacked via of the present invention.
Figure 7:
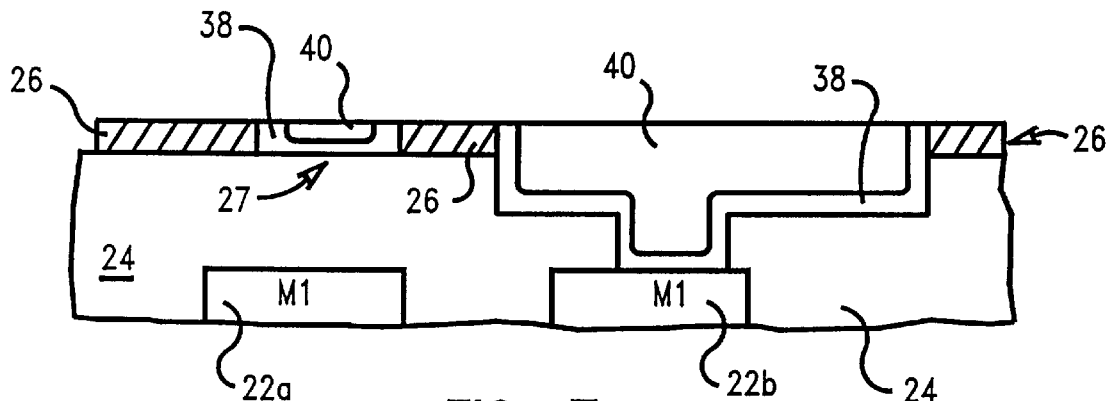
FIG. 7 is a side elevational view of a seventh stage of construction of the preferred stacked via of the present invention.

In the next steps of constructing the stacked via of the present invention, the resist layer 28 is etched wet stripped away, and, as shown in FIG. 6, there is deposited a thin metallic liner layer 38 of, for example, tantalum, by sputtering or other suitable deposition method, which layer 38 conforms to the contours of the layers below. Thereafter, a metallic layer 40 of, for example, copper, is electrolytically plated over the tantalum liner 38.

After depositing conductive copper layer 40, the surface thereof is planarized (FIG. 7) by chemical mechanical polishing (CMP) utilizing an ammonium persulfate/ potassium hydroxide slurry of pH 10, developed by IBM and disclosed in IBM Technical Disclosure Bulletin Vol. 37, No. 10, (October 1994) pp. 187–188. Optionally, copper passivants such as azoles may be applied to a copper layer to maximize the removal rate of the copper while minimizing the removal of the nitride insulator layer 26, as disclosed in IBM Technical Disclosure Bulletin Vol. 36, No. 2, (February 1993) pp. 171–172. The conductive layer 40 may be encapsulated by a thin layer of copper germanide ($Cu_3Ge$) formed thereon for improving chemical-mechanical polishing of the conductive layer, as disclosed in IBM Technical Disclosure Bulletin Vol. 37, No. 9, (September 1994) pp. 145–146 and IBM Technical Disclosure Bulletin Vol. 36, No. 4, (April 1993) pp. 335–336.

After planarization of the conductive layer, a small amount of both copper layer 40 and tantalum layer 38 may be left in the groove in the stacked through via area 27. Alternatively, through a small amount of over polishing, or if the nitride etch stop layer 26 is sufficiently thin, the copper 40 and tantalum 38 layer in region 27, the stacked via region, may be completely polished out. In either event, the tantalum liner layer 38 and copper layer 40 remain over and in contact with M1 conductive layer 22b to form an M2 conductive interconnect via.

Figure 8:
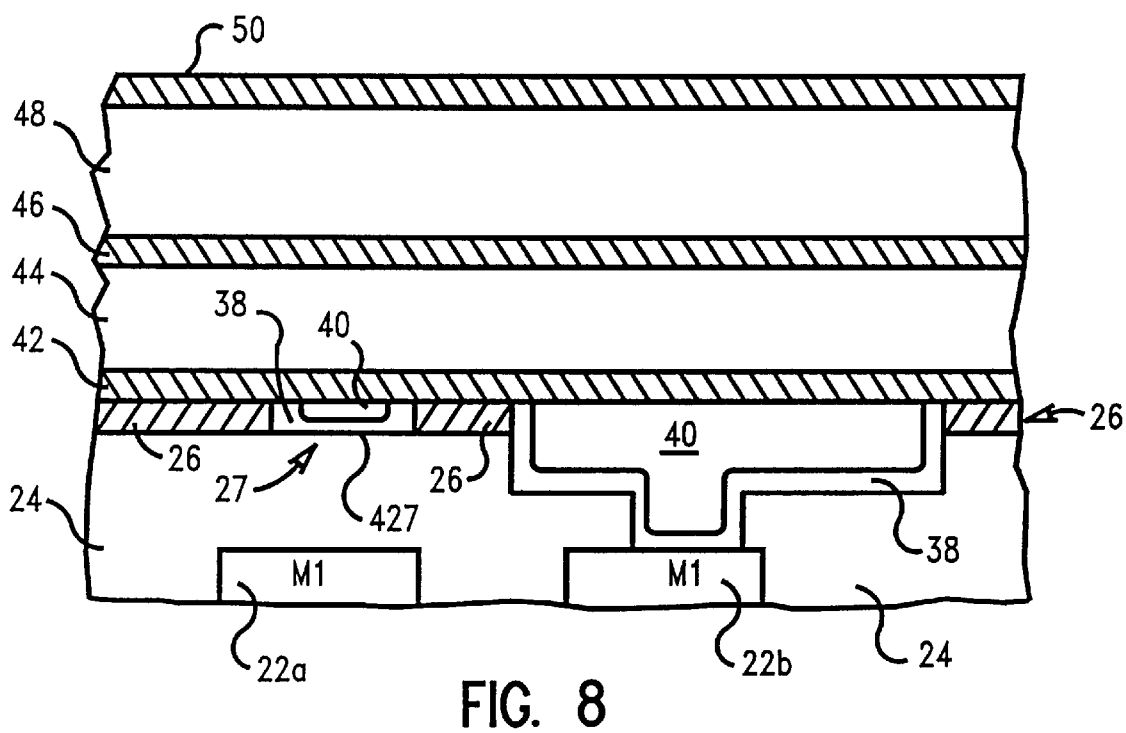
FIG. 8 is a side elevational view of an eighth stage of construction of the preferred stacked via of the present invention.
Figure 9:
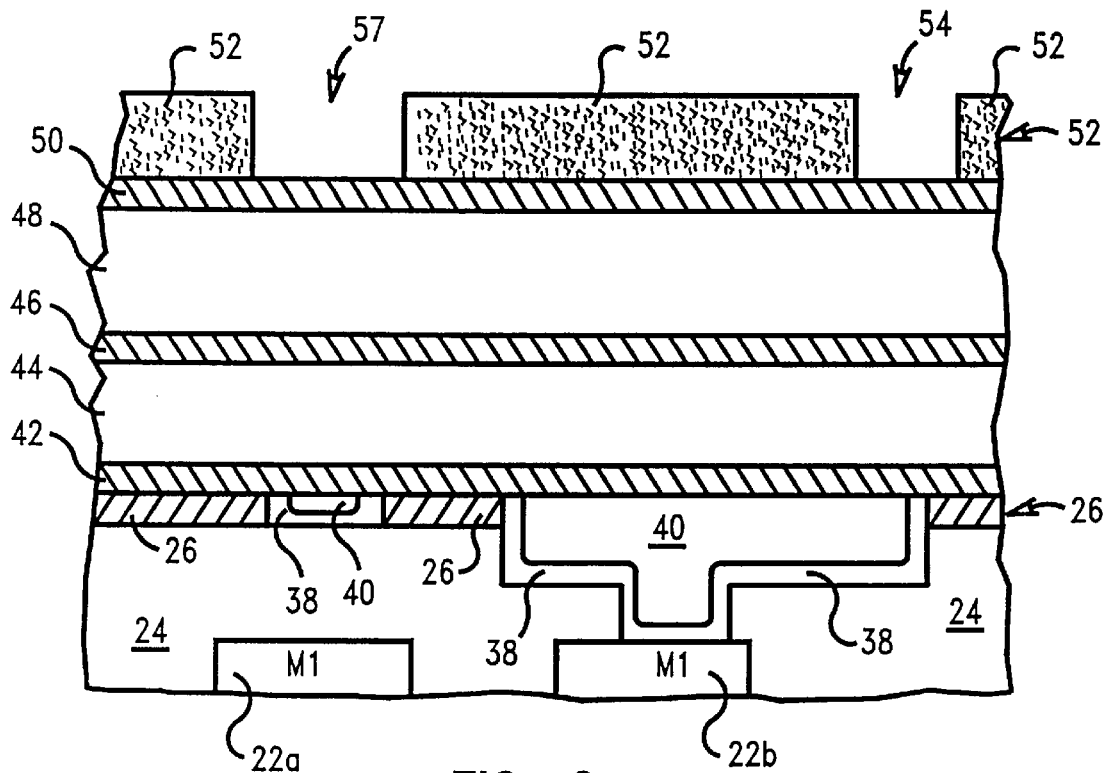
FIG. 9 is a side elevational view of a ninth stage of construction of the preferred stacked via of the present invention.
Figure 10:
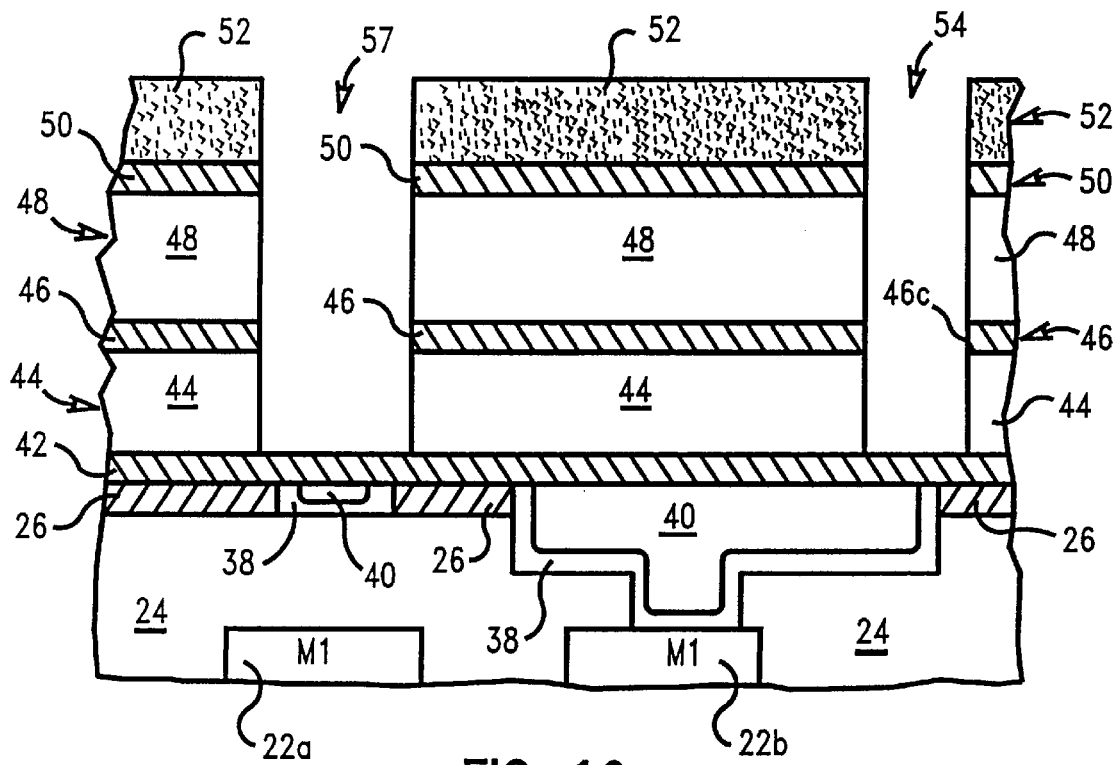
FIG. 10 is a side elevational view of a tenth stage of construction of the preferred stacked via of the present invention.

To set the structure up for the M3 to M2 dual damascene structure, FIG. 8 shows the sequential deposition of a stack of nitride etch stop layer 42, polyimide insulator layer 44, nitride etch stop layer 46, polyimide insulator layer 48 and nitride etch stop layer 50. Etch stop layer 42 is preferably deposited directly over and in partial contact with etch stop layer 26, as shown. This creates a "hidden mask region" 427. In FIG. 9, developed resist layer 52 exposes portions of the upper surface of nitride etch stop layer 50 to define openings to create an M3 via interconnect region 54, as well as the stacked through-via interconnect region 57. The nitride etch stop layers and polyimide insulator layers are then etched (FIG. 10) in through-via region 57, stopping on the nitride etch stop layer 42 covering the M2 conductor interconnect level (copper 40/tantalum 38). These etching steps are performed by etching nitride, stopping on or in the polyimide, etching the polyimide, stopping directly on the nitride, and so on, using well-known etchants and techniques.

Figure 11:
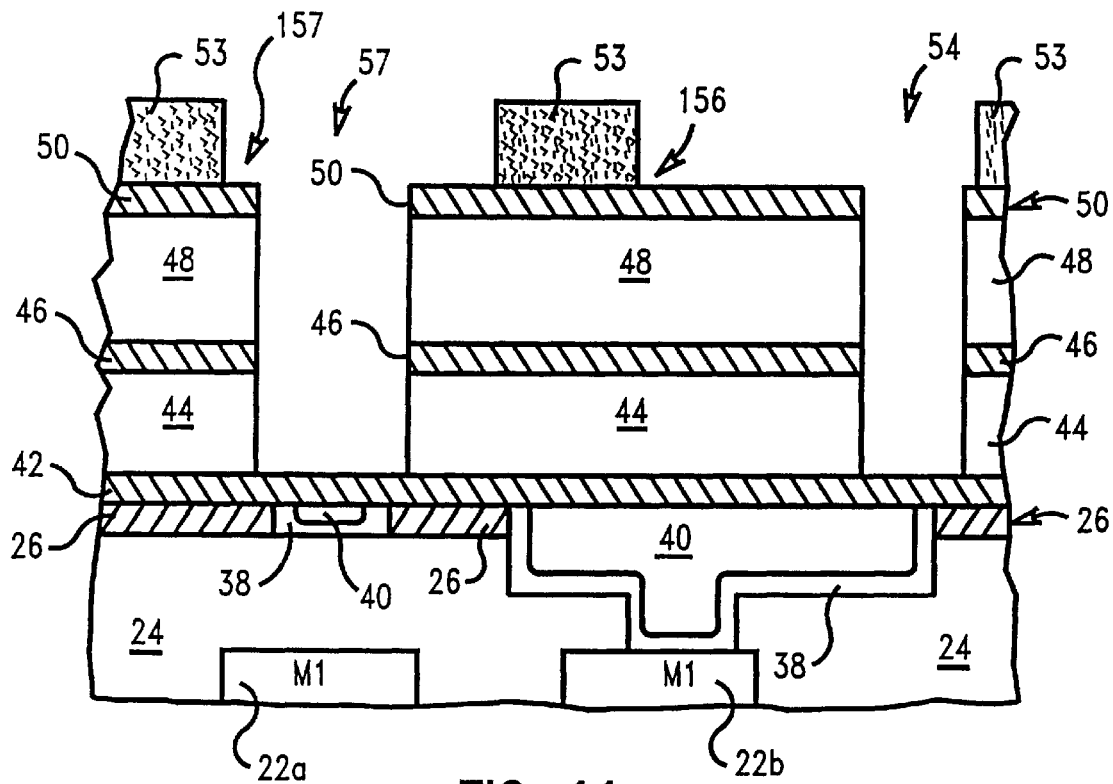
FIG. 11 is a side elevational view of an eleventh stage of construction of the preferred stacked via of the present invention.
Figure 12:
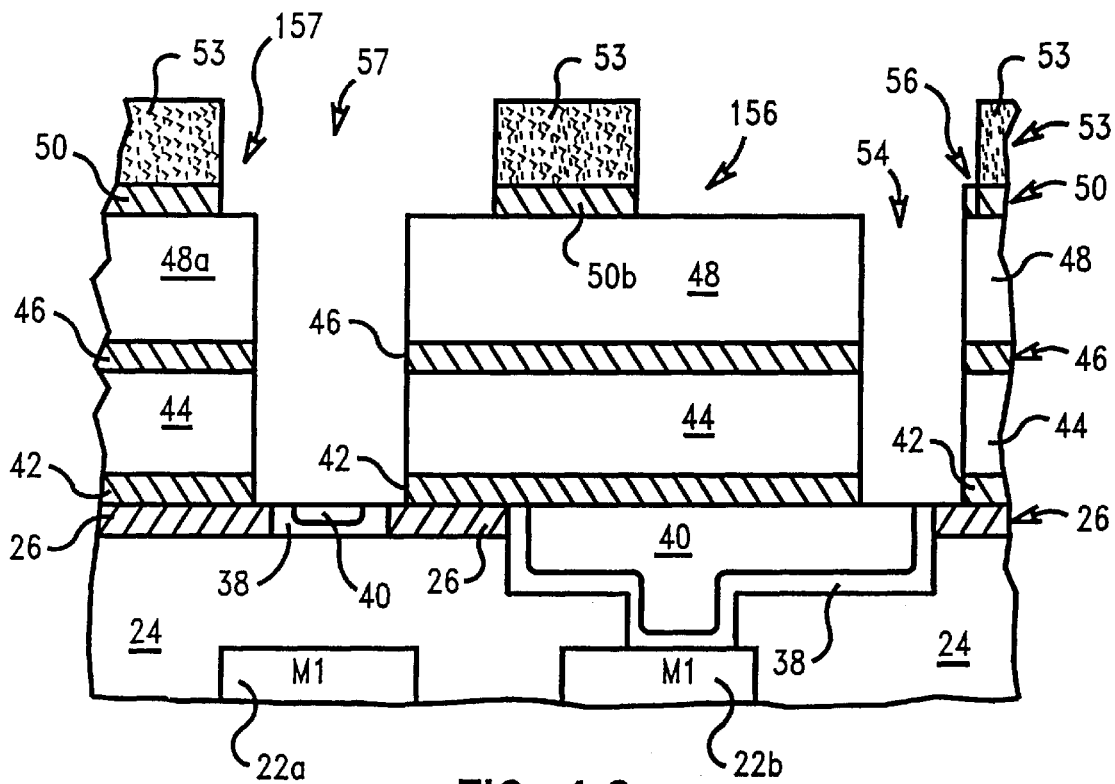
FIG. 12 is a side elevational view of a twelfth stage of construction of the preferred stacked via of the present invention.

Resist layer 52 is then stripped and new resist layer 53 is deposited, exposed and developed to define openings 156 and 157 as shown in FIG. 11, exposing portions of the top surface of silicon nitride layers 50 and 42. New resist layer 53 is used to etch the exposed silicon nitride layer 50 and exposed nitride etch stop layer 42 shown in FIG. 12. Such etching exposes the top surface of polyimide insulator layer portion 48 which is not covered by resist layer 53. Also exposed by the etching step are the copper 40, tantalum 38 M2 via layers and the copper 40, tantalum 38 layers in the stacked via region (if the latter exists). However, the etching at this stage is only partially complete so as not to remove all of the nitride etch stop layer portion 26. It is preferred that some of nitride etch stop layer portion 26 (the original nitride on the first polyimide region for M2) remains to provide an etch stop if M3 via to M2 line 22b misalignment occurs in that region.

Figure 13:
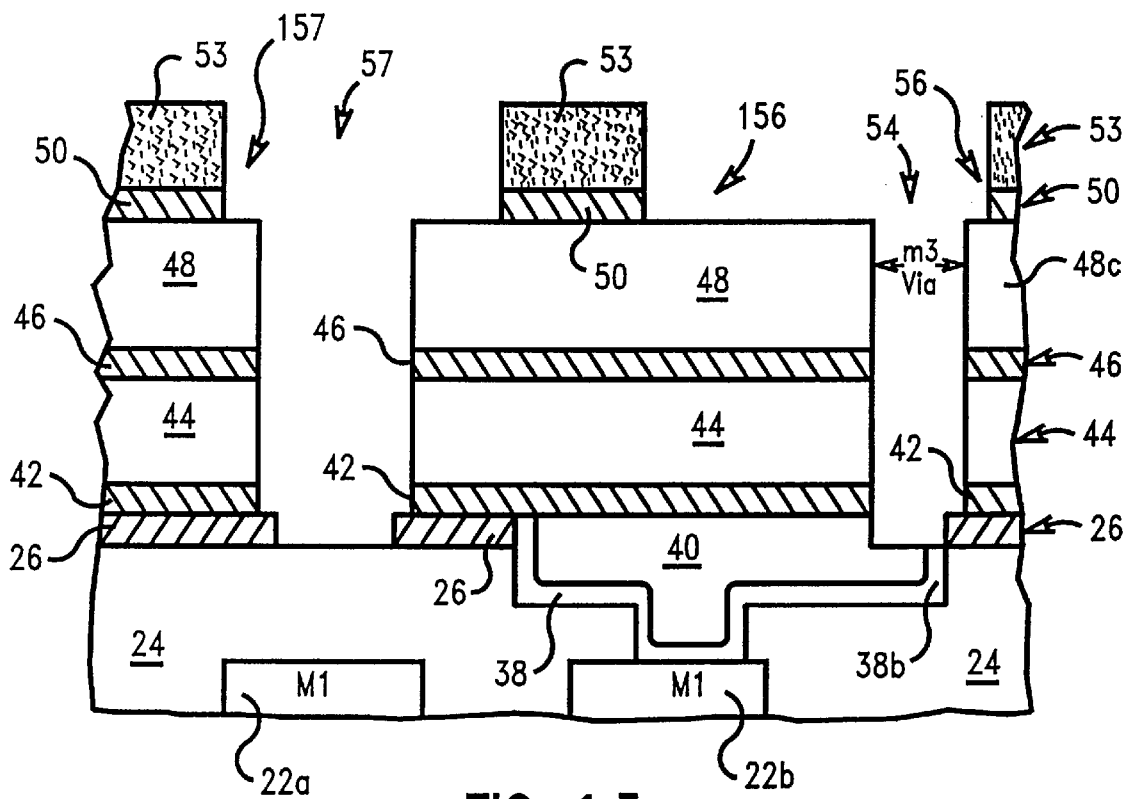
FIG. 13 is a side elevational view of a thirteenth stage of construction of the preferred stacked via of the present invention.
Figure 14:
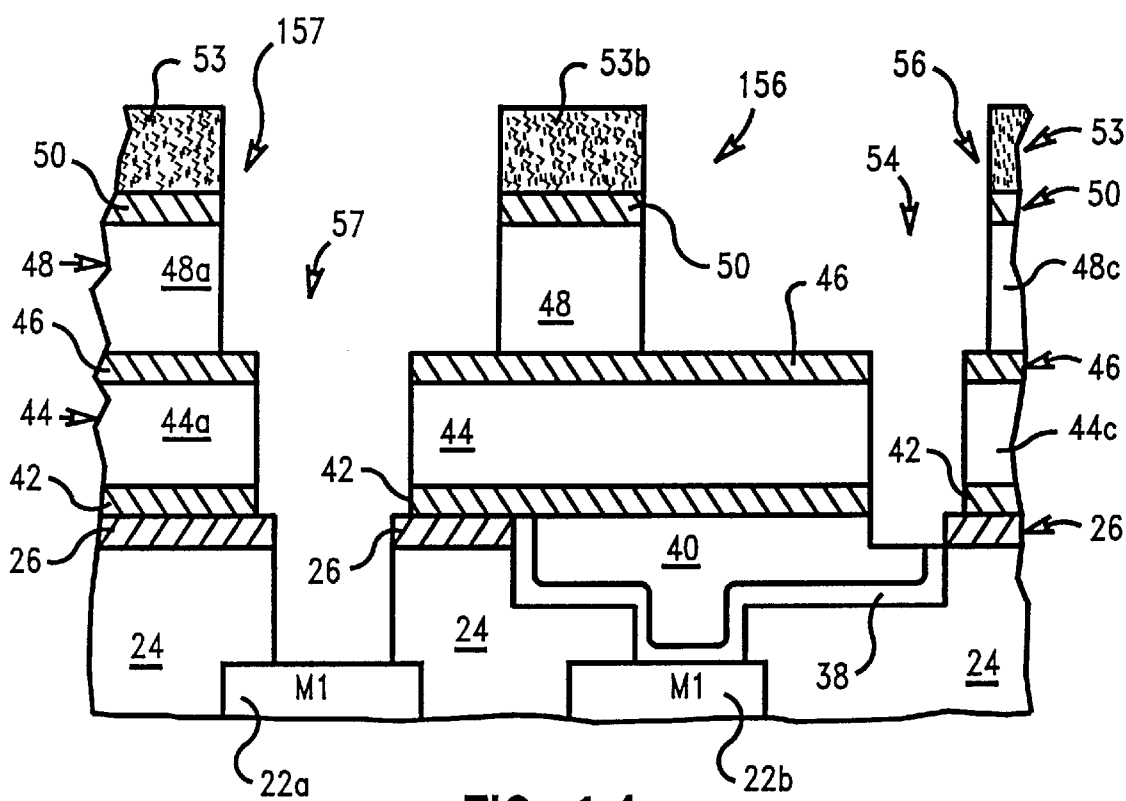
FIG. 14 is a side elevational view of a fourteenth stage of construction of the preferred stacked via of the present invention.

In FIG. 13, a small amount of copper 40, tantalum 38 is removed from the M2 via surface through either a quick, dilute wet etch or an ozone dry etch. Such metallic etch also completely removes whatever copper 40, tantalum 38 conductive line remained from previous steps. Various methods are known to etch small amounts of copper/tantalum. In FIG. 14, the M3 line openings 56a, 56b are shown etched by removing the portions of polyimide insulator layer 48 not covered by resist layer 53. At the same time, final stacked-though via 27 is defined to the M1 level 22a by removing the portions of polyimide insulator layer 48 not covered by resist layer 53. It should be noted that, without nitride etch stop layer 26, polyimide insulator 24 under that region would be erroneously etched.

Figure 15:
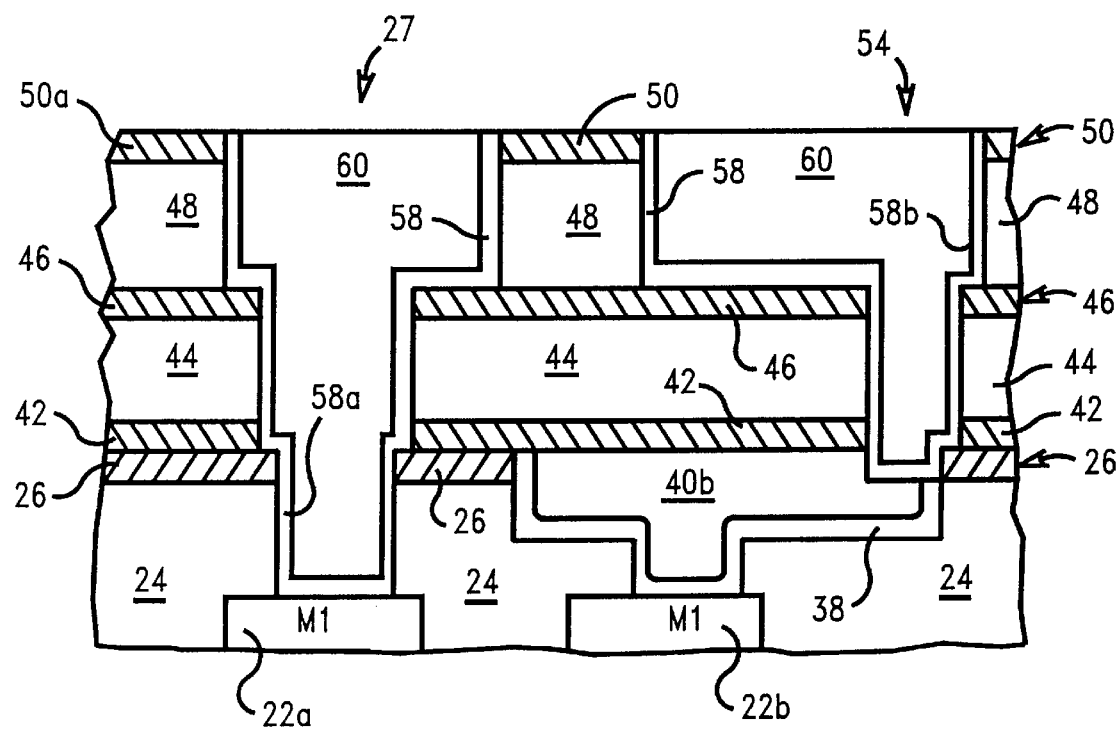
FIG. 15 is a side elevational view of a fifteenth stage of construction of the preferred stacked via of the present invention.

Finally, there is shown in FIG. 15 the removal of resist layer 53. Thin tantalum liner layer 58 is deposited to conform to the opening in stacked through-via region 27 and layer 58 is deposited to conform to the opening in M3 via region 54. Subsequently, conductive copper is deposited by plating over the tantalum liner in stacked through-via region 27 (60) and in M3 via region 54 (60) to form a third interconnect region. After deposition, the tantalum/copper is polished and planarized as described previously to make the surface substantially coplanar with nitride etch stop layer 50 to provide a third interconnect region which may be used to provide a connection with the first interconnect region M1 and a region above the third interconnect region which may contain electronic devices or other connections. The copper in the via in regions 27 is integral and continuous in its formation, and contains no intermediate liner or other breaks as it extends through the various intermediate insulating layers shown.

Thus, the present invention describes a new and useful method and structure to create a stacked-through via for electronic circuits by utilizing a "hidden mask image" from a previous level and making a stacked through via without any additional masks, without any additional interconnection resistance and without impact to ground rules for the electronic structures.

Figure 16:
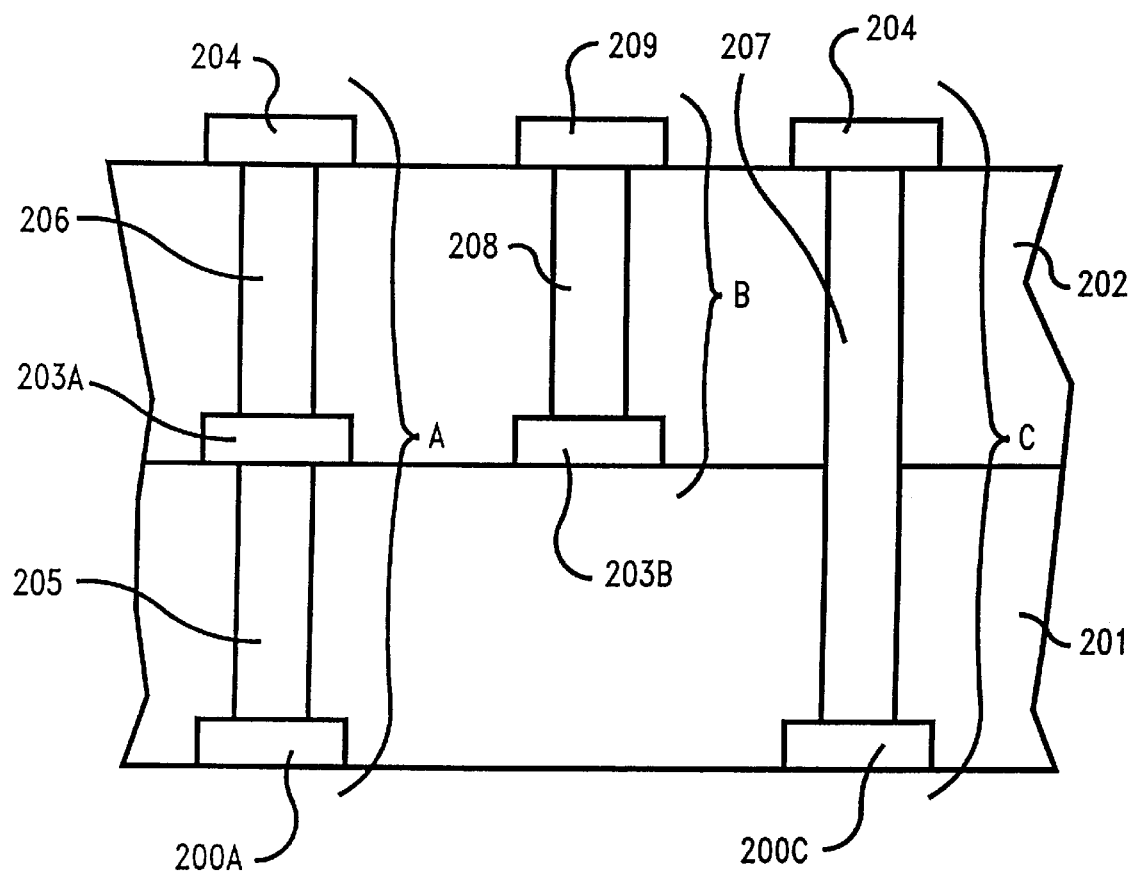
FIG. 16 is a side elevational view of another stacked via of the present invention.

There is another embodiment that is another version of the present invention that does not utilize the hidden mask concept but impacts the ground rules. Referring to FIG. 16, a first level interconnect region or metal M1 comprises conductors 200A and 200C which are defined and overlayed with a first insulator layer 201. Via 205 is then etched and formed in first insulator 201. Second level interconnect region or metal M2 203A is defined and overlays first level metal M1 200A and via 205. Second level metal conductor 203B does not overlay any first level metal. No second level metal is defined over first level metal conductor 200C. A second insulator layer 202 is then formed over first insulator layer 201 and vias 206 and 208 are formed over second level metal conductors 203A and 203B, respectively. Vias 206 and 208 when formed in second insulator layer 202 will not travel down past second level metal 203A and 203B respectively because vias 206 and 208 are aligned within the perimeters of 203A and B. Via 207 is defined at the same time during the same etch as vias 206 and 208, and via 207 continues all the way through second insulator layer 202 and first insulator layer 201 to contact first level metal M1 conductor 200C forming a stacked through via 207 because there is no blocking second level metal M2 aligned or within insulator layer 202. Thus, interconnect portion A interconnects M3 metal pad 204 to M2 metal pad 203A to M1 metal pad 200A. Interconnect portion B interconnects M3 metal pad 209 to M2 metal pad 203B. Interconnect portion C (including the portion of via 207 extending downward from pad 204) continuously interconnects M3 metal pad 204 to M1 metal pad 200C without contacting an intervening portion of the second interconnect or metal level M2.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for connecting two levels of interconnect vertically spaced from each other by another level of interconnect comprising the steps of:

a) forming a first interconnect region to which contact is to be made;

b) forming a first insulating layer over the interconnect region;

c) forming an etch-stop layer over the first insulating layer;

d) etching the etch stop layer to form an opening at a position over said first interconnect region;

e) forming a second interconnect region in contact with said first insulating layer and above said first interconnect region;

f) forming a second insulating layer over said first insulation layer, said etch stop layer, and the etch stop layer opening;

g) forming an opening in said second insulating layer, said opening in said second insulating layer overlapping said opening in said etch stop layer;

h) extending said opening in said second insulating layer through said opening in said etch stop layer and said first insulating layer; and i) filling the openings in said first and second insulating layers with a conductor to create a connection between said first interconnect region and a region above said second insulating layer, the portion of the conductor in said first insulating layer being filled to conform to the opening in said etch stop layer.

2. The method of claim 1 wherein said second insulating layer is formed over said second interconnect region.

3. The method of claim 1 wherein said first interconnect region comprises a conductive line formed in said first insulating layer.

4. The method of claim 1 wherein said second interconnect region includes a conductor formed in said first insulating layer.

5. The method of claim 1 wherein said second interconnect region contacts a portion of said first interconnect region.

6. The method of claim 1 wherein said opening in said etch stop layer and said first and second insulating layer comprises a first opening and further including the steps of forming a second opening in said etch stop layer and said second insulating layer overlapping said second interconnect region and filling said second opening with a conductor to create a connection between said second interconnect region and a region above said second insulating layer.

7. The method of claim 6 wherein said step of forming a second opening in said etch stop layer does not remove any etch stop layer portion adjacent to said second interconnect region and over said first insulating layer.

8. The method of claim 1 wherein said etch stop layer comprises a first etch stop layer and further including the steps of forming a second etch stop layer over said second insulating layer and forming a third insulating layer over said second etch stop layer, and wherein step (g) includes forming openings in said second etch stop layer and said third insulating layer which overlap said opening in the first etch stop layer and step (i) includes filling the openings in said second etch stop layer and said third insulating layer with the conductor to create a connection between said first interconnect region and a region above said third insulating layer.

9. The method of claim 8 wherein said opening in said first and second etch stop layers and said first, second and third insulating layers comprises a first opening and further including the steps of forming a second opening in said etch stop layers and said insulating layers overlapping said second interconnect region and filling said second opening with a conductor to create a connection between said second interconnect region and a region above said third insulating layer.

10. The method of claim 1 further including depositing a conductor in the opening in said etch stop layer and then removing the conductor in the opening in the etch stop layer when extending the opening in said second insulating layer through said opening in said etch stop layer and said first insulating layer.

11. A method for connecting two levels of interconnect vertically spaced from each other by another level of interconnect comprising the steps of:
   a) forming a first interconnect region to which contact is to be made;
   b) forming a first insulating layer over the interconnect region;
   c) forming an etch-stop layer over the first insulating layer;
   d) etching the etch stop layer to form an opening at a position over said first interconnect region;
   e) forming a second interconnect region in contact with said first insulating layer and above and in contact with said first interconnect region;
   f) forming a second insulating layer over said first insulation layer, said etch stop layer, the etch stop layer opening and said second interconnect region;
   g) forming an opening in said second insulating layer, said opening in said second insulating layer overlapping said opening in said etch stop layer;
   h) extending said opening in said second insulating layer through said opening in said etch stop layer and said first insulating layer; and
   i) filling the openings in said first and second insulating layers with a conductor to create a connection between said first interconnect region and a region above said second insulating layer, the portion of the conductor in said first insulating layer being filled to conform to the opening in said etch stop layer.

12. The method of claim 11 wherein said first interconnect region comprises a conductive line formed in said first insulating layer.

13. The method of claim 11 wherein said second interconnect region includes a conductor formed in said first insulating layer.

14. The method of claim 11 wherein said opening in said etch stop layer and said first and second insulating layer comprises a first opening and further including the steps of forming a second opening in said etch stop layer and said second insulating layer overlapping said second interconnect region and filling said second opening with a conductor to create a connection between said second interconnect region and a region above said second insulating layer.

15. The method of claim 14 wherein said step of forming a second opening in said etch stop layer does not remove any etch stop layer portion adjacent to said second interconnect region and over said first insulating layer.

16. The method of claim 11 wherein said etch stop layer comprises a first etch stop layer and further including the steps of forming a second etch stop layer over said second insulating layer and forming a third insulating layer over said second etch stop layer, and wherein step (g) includes forming openings in said second etch stop layer and said third insulating layer which overlap said opening in the first etch stop layer and step (i) includes filling the openings in said second etch stop layer and said third insulating layer with the conductor to create a connection between said first interconnect region and a region above said third insulating layer.

17. The method of claim 16 wherein said opening in said first and second etch stop layers and said first, second and third insulating layers comprises a first opening and further including the steps of forming a second opening in said etch stop layers and said insulating layers overlapping said second interconnect region and filling said second opening with a conductor to create a connection between said second interconnect region and a region above said third insulating layer.

18. The method of claim 11 further including depositing a conductor in the opening in said etch stop layer and then removing the conductor in the opening in the etch stop layer when extending the opening in said second insulating layer through said opening in said etch stop layer and said first insulating layer.

19. A method for connecting two levels of interconnect vertically spaced from each other by another level of interconnect comprising the steps of:
   a) forming a first interconnect region to which contact is to be made, said first interconnect region comprising a conductive line formed in said first insulating layer;
   b) forming a first insulating layer over the interconnect region;
   c) forming an etch-stop layer over the first insulating layer;
   d) etching the etch stop layer to form an opening at a position over said first interconnect region;
   e) forming a second interconnect region in contact with said first insulating layer and above and in contact with said first interconnect region, said second interconnect region including a conductor formed in said first insulating layer;
   f) forming a second insulating layer over said first insulation layer, said etch stop layer and said second interconnect region;
   g) forming an opening in said second insulating layer, said opening in said second insulating layer overlapping said opening in said etch stop layer;
   h) extending said opening in said second insulating layer through said first insulating layer; and
   i) filling the openings in said first and second insulating layers with a conductor to create a connection between said first interconnect region and a region above said second insulating layer.

20. The method of claim 19 wherein said opening in said etch stop layer and said first and second insulating layer comprises a first opening and further including the steps of forming a second opening in said etch stop layer and said second insulating layer overlapping said second interconnect region and filling said second opening with a conductor to create a connection between said second interconnect region and a region above said second insulating layer.

21. The method of claim 20 wherein said step of forming a second opening in said etch stop layer does not remove any etch stop layer portion adjacent to said second interconnect region and over said first insulating layer.

22. The method of claim 19 wherein said etch stop layer comprises a first etch stop layer and further including the steps of forming a second etch stop layer over said second insulating layer and forming a third insulating layer over said second etch stop layer, and wherein step (g) includes forming openings in said second etch stop layer and said third insulating layer which overlap said opening in the first etch stop layer and step (i) includes filling the openings in said second etch stop layer and said third insulating layer with the conductor to create a connection between said first interconnect region and a region above said third insulating layer.

23. The method of claim 22 wherein said opening in said first and second etch stop layers and said first, second and third insulating layers comprises a first opening and further including the steps of forming a second opening in said etch stop layers and said insulating layers overlapping said second interconnect region and filling said second opening with a conductor to create a connection between said second interconnect region and a region above said third insulating layer.

24. A method for connecting two levels of interconnect vertically spaced from each other by another level of interconnect comprising the steps of:

a) forming a first interconnect region to which contact is to be made;
   b) forming a first insulating layer over the interconnect region;
   c) forming an etch-stop layer over the first insulating layer;
   d) etching the etch stop layer to form an opening at a position over said first interconnect region;
   e) forming a second interconnect region in contact with said first insulating layer and above said first interconnect region, said second interconnect region including a conductor formed in said first insulating layer;
   f) forming a second insulating layer over said first insulation layer and said etch stop layer;
   g) forming an opening in said second insulating layer, said opening in said second insulating layer overlapping said opening in said etch stop layer;
   h) extending said opening in said second insulating layer through said first insulating layer; and
   i) filling the openings in said first and second insulating layers with a conductor to create a connection between said first interconnect region and a region above said second insulating layer.

25. A method for connecting two levels of interconnect vertically spaced from each other by another level of interconnect comprising the steps of:

a) forming a first interconnect region to which contact is to be made;
   b) forming a first insulating layer over the interconnect region;
   c) forming an etch-stop layer over the first insulating layer;
   d) etching the etch stop layer to form an opening at a position over said first interconnect region;
   e) forming a second interconnect region in contact with said first insulating layer and above and in contact with said first interconnect region, said second interconnect region including a conductor formed in said first insulating layer;
   f) forming a second insulating layer over said first insulation layer, said etch stop layer and said second interconnect region;
   g) forming an opening in said second insulating layer, said opening in said second insulating layer overlapping said opening in said etch stop layer; p1 h) extending said opening in said second insulating layer through said first insulating layer; and
   i) filling the openings in said first and second insulating layers with a conductor to create a connection between said first interconnect region and a region above said second insulating layer.

* * * * *

UNITED STATES PATENT AND TRADEMARK OFFICE
CERTIFICATE OF CORRECTION

PATENT NO.    : 6,143,640
DATED         : November 7, 2000
INVENTOR(S)   : John E. Cronin et al.

Page 1 of 1

It is certified that error appears in the above-identified patent and that said Letters Patent is hereby corrected as shown below:

In the Claims

Column 12, claim 25,
Lines 35-39, delete

" g) forming an opening in said second insulating layer, said opening in said second insulating layer overlapping said opening in said etch stop layer; p1 h) extending said opening in said second insulating layer through said first insulating layer; and"

and substitute therefore

--g) forming an opening in said second insulating layer, said opening in said second insulating layer overlapping said opening in said etch stop layer;
   h) extending said opening in said second insulating layer through said first insulating layer; and --

Signed and Sealed this

Nineteenth Day of June, 2001

*Attest:*

NICHOLAS P. GODICI
*Attesting Officer*    Acting Director of the United States Patent and Trademark Office